(12) United States Patent
Jeong et al.

(10) Patent No.: US 9,711,698 B2
(45) Date of Patent: Jul. 18, 2017

(54) LIGHT-EMITTING DEVICE

(71) Applicants: ASIA BRIDGE JAPAN CO., LTD., Kanagawa (JP); Hae Woon Jeong, Seoul (KR)

(72) Inventors: Hae Woon Jeong, Seoul (KR); Hidenori Nonaka, Kanagawa (KR); Yo Hoon Cho, Gyeonggi-do (KR)

( * ) Notice: Subject to any disclaimer, the term of this patent is extended or adjusted under 35 U.S.C. 154(b) by 0 days.

(21) Appl. No.: 15/036,578

(22) PCT Filed: Nov. 13, 2013

(86) PCT No.: PCT/JP2013/080728
§ 371 (c)(1),
(2) Date: Jun. 21, 2016

(87) PCT Pub. No.: WO2015/071985
PCT Pub. Date: May 21, 2015

(65) Prior Publication Data
US 2016/0300986 A1 Oct. 13, 2016

(51) Int. Cl.
*H01L 33/58* (2010.01)
*G02B 6/00* (2006.01)

(52) U.S. Cl.
CPC .............. *H01L 33/58* (2013.01); *G02B 6/00* (2013.01); *H01L 2933/0091* (2013.01)

(58) Field of Classification Search
CPC .................. H01L 33/58; H01L 2933/0091
(Continued)

(56) References Cited

U.S. PATENT DOCUMENTS 7,473,013 B2 * 1/2009 Shimada ................... F21K 9/00
257/98
7,602,559 B2 * 10/2009 Jang .......................... F21V 5/04
359/726

(Continued)

FOREIGN PATENT DOCUMENTS

JP 6-62185 3/1994
JP 9-270534 10/1997
(Continued)

*Primary Examiner* — Mark Tornow
(74) *Attorney, Agent, or Firm* — Faegre Baker Daniels LLP

(57) ABSTRACT

The present invention provides a solution increasing illuminance of the irradiation surface in a vicinity of the optical axis and suppressing the generation of the yellow ring phenomenon. The present invention is for a light emitting device 1 having a light emitting element 2 and a light control member 3, the light control member has a light incident surface 31 and light emitting surface 32, when the intersection point of the optical axis and a light emitting surface of the light emitting element 2 is defined as a base point, an angle formed by the optical axis and a line connecting the base point and an optional point is defined as α1, and distance between the optional point of the light incident surface and the base point is defined as D1, for the light incident surface, the distance D1 is increasing as increasing the angle α1 if the angle α1 is 0≤α1<β1 (radian), and the distance D1 is decreasing as increasing the angle α1 if β1β2α1<(p/2) (radian). when an angle formed by the optical axis and a line connecting the base point and an optional point of the light emitting surface is defined as α1α2 and distance between the optional point of the light emitting surface and the base point is defined as D2, for the light emitting surface, the distance D2 is decreased in range of 0≤a2<predetermined angle ?2 (radian), and the distance D2 is increased in range of ?2≤a2<(p/2) (radian).

6 Claims, 5 Drawing Sheets

(58) Field of Classification Search
USPC .......................................................... 257/98
See application file for complete search history.

(56) References Cited

U.S. PATENT DOCUMENTS

| | | | |
|---|---|---|---|
| 2006/0067640 A1* | 3/2006 | Hsieh .................... | F21V 7/0091 385/146 |
| 2006/0291245 A1* | 12/2006 | Shimada ................... | F21V 5/04 362/612 |
| 2011/0096553 A1* | 4/2011 | Shimokawa .............. | F21V 5/04 362/311.02 |

FOREIGN PATENT DOCUMENTS

| | | |
|---|---|---|
| JP | 2002-221658 | 8/2002 |
| JP | 2008-4415 | 1/2008 |
| JP | 2011-249294 | 12/2011 |

\* cited by examiner

[Figure 1]
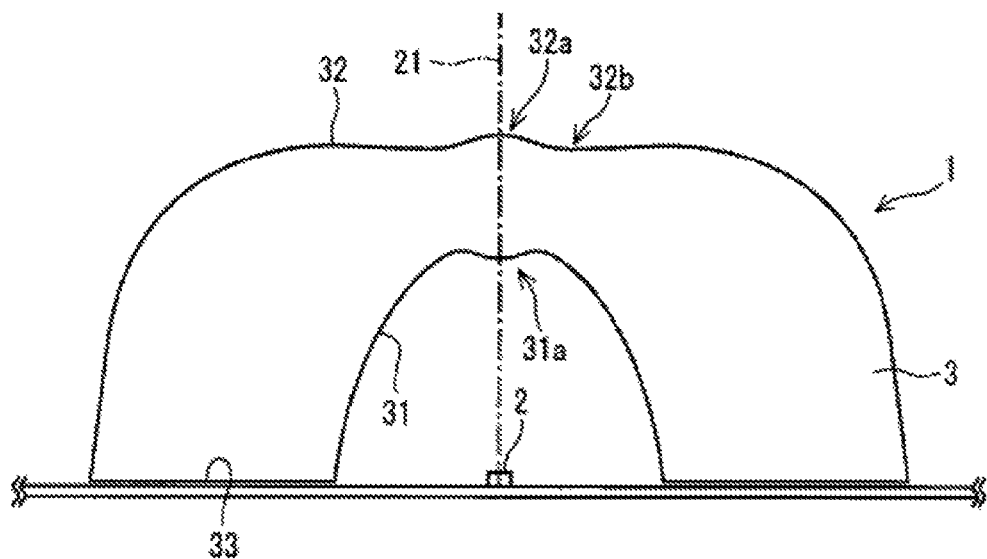
[Figure 2]
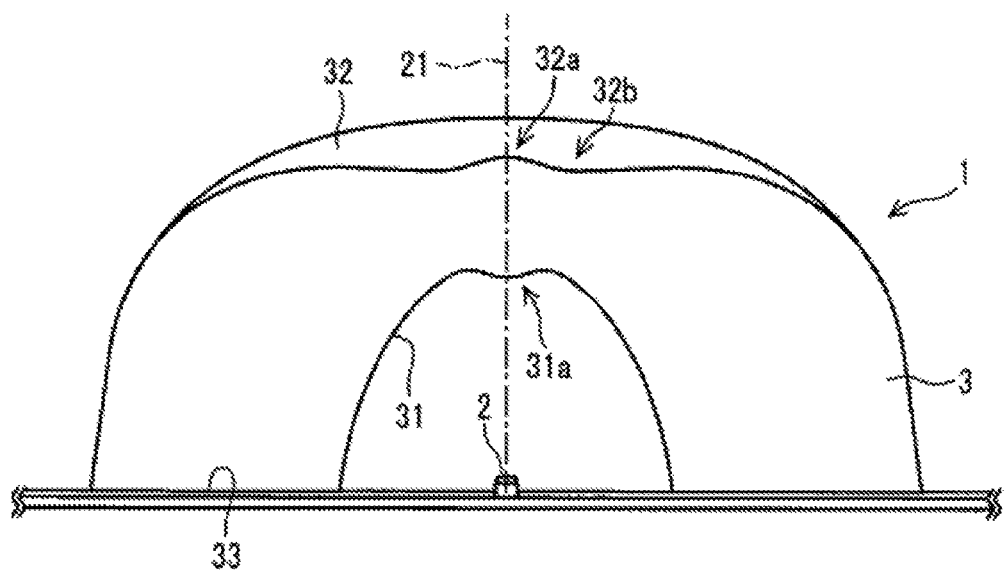

[Figure 3]
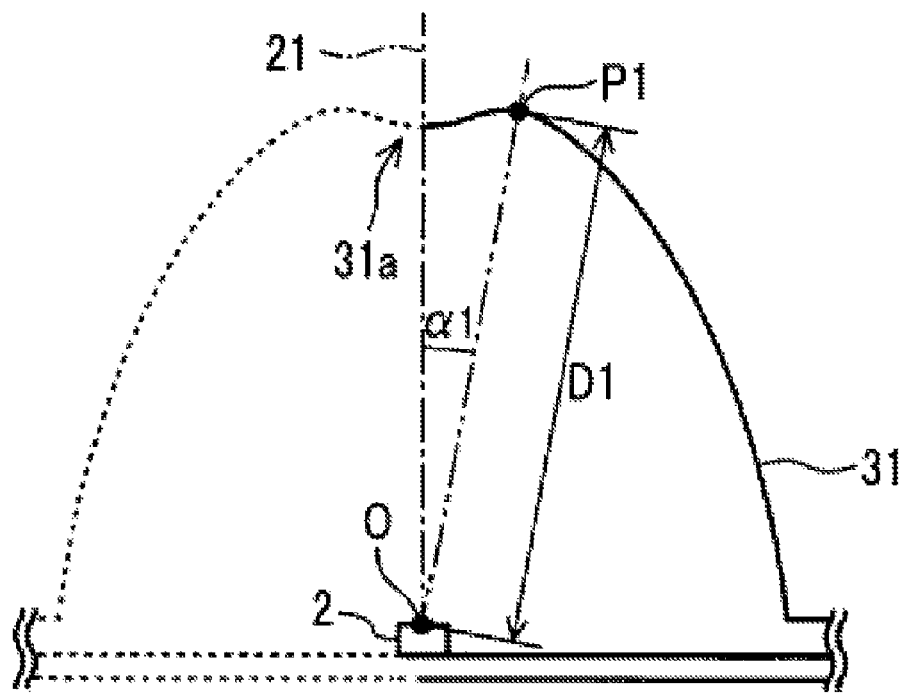
[Figure 4]
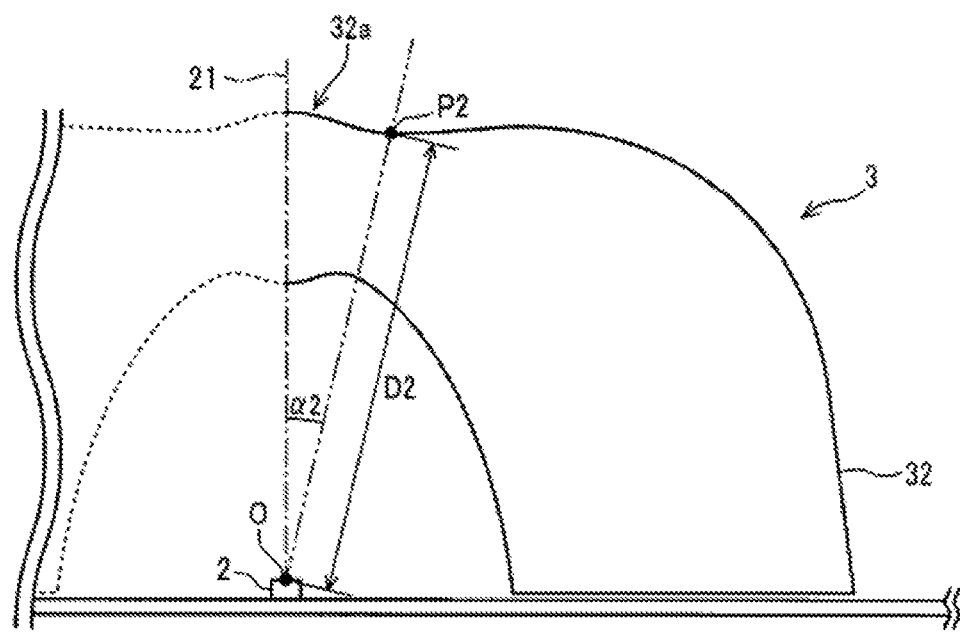

【Figure 5】
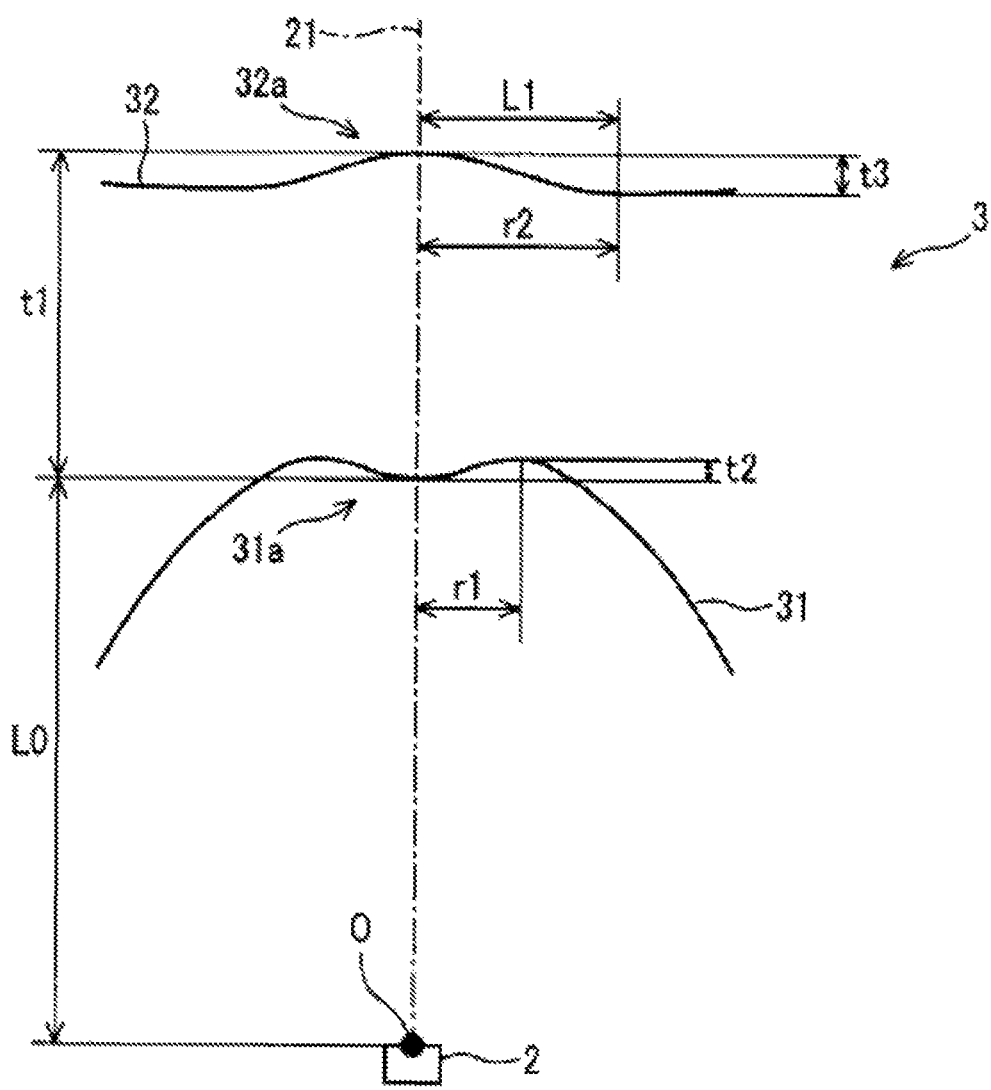

[Figure 6]
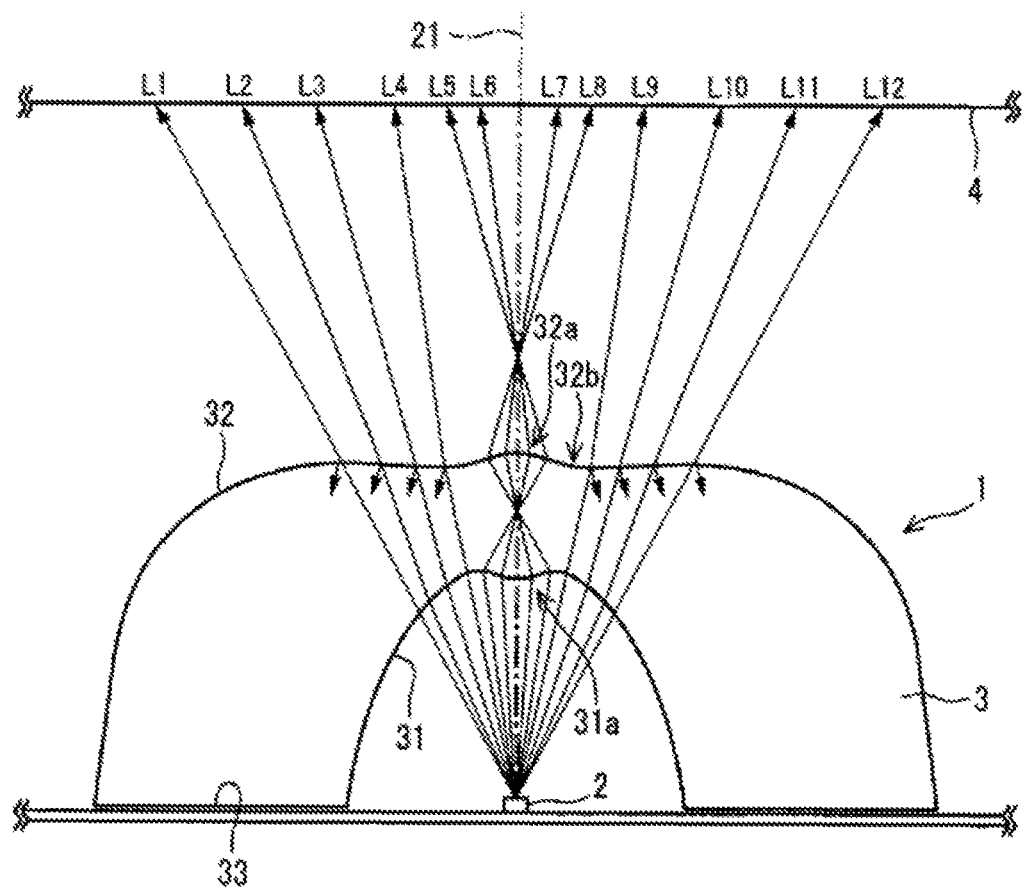

【Figure 7】
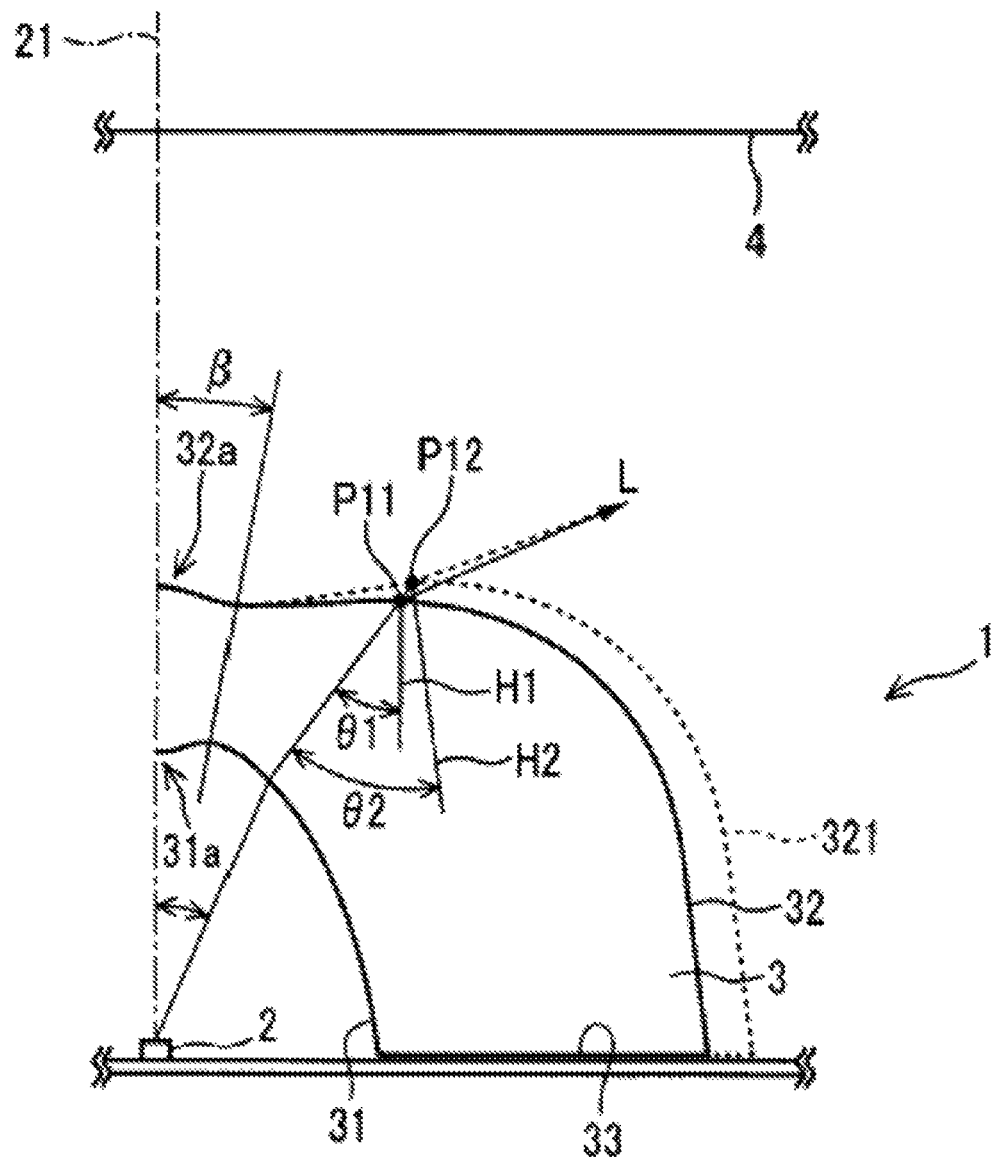

LIGHT-EMITTING DEVICE

CROSS-REFERENCE TO RELATED APPLICATIONS

This application is a U.S. National Phase filing of PCT/JP2013/080728, filed Nov. 13, 2013, the entire disclosure of which is hereby expressly incorporated by reference herein.

TECHNICAL FIELD

The present invention relates to a light emitting device having a light control member for controlling light emitted from a light emitting element.

BACKGROUND ART

In a conventional light emitting device, a light incident surface that is an inner surface of the light control member is formed as a bell shape to diverge light emitted from the light emitting element and to reduce reflectance by the Fresnel reflection, and a cross-sectional shape of a light emitting surface on the outer surface of the light control member is formed to have a contour line with a tangent substantially perpendicular to an optical axis in a vicinity of the optical axis thereby having small inclination change, and to have the contour line at a distance from the optical axis with inclination change becoming large and gradually parallel to the optical axis (for example, see Patent Document 1).

Related Art: Japanese patent publication No. 2009-044016 (2009 Feb. 26)

DISCLOSURE

Technical Problem

However, in the conventional art described above, since light distribution of the light emitting element has a characteristic that luminous flux density in a vicinity of the optical axis is high, a light diffusion angle between incident light and a normal line at the light emitting surface in a vicinity of the optical axis of the light control member should be large in order to keep the uniformity of the irradiation surface constantly in a vicinity of the optical axis where the light is concentrated, the Fresnel reflection loss is increased, illuminance of the irradiation surface in a vicinity of the optical axis is decreased, and deterioration of the color purity in the irradiation surface is brought and the yellow ring phenomenon occurring yellow color with respect to white color of the original emitted light if large light diffusion angle is prepared in a vicinity of the optical axis.

The present invention has a subject to solve these problems and an object to increase the illuminance of the irradiation surface in a vicinity of the optical axis, and suppress the occurrence of yellow ring phenomenon.

Technical Solution

Therefore, the present invention is for a light emitting device including a light emitting element and a light control member which has a shape of rotational symmetry with respect to the optical axis and controls and emits light incident from the light emitting element. The light control member has a cavity formed between itself and the light emitting element, a light incident surface through which light emitted from the light emitting element is inputted, and a light emitting surface through which the light inputted through the light incident surface is outputted. The light incident surface and the light emitting surface respectively have convex portions formed in a vicinity of the optical axis and diffuse light in a vicinity of the optical axis.

Advantageous Effects

Thus the present invention can obtain effects that the illuminance of the irradiation surface in a vicinity of the optical axis is increased and the occurrence of yellow ring phenomenon is suppressed.

DESCRIPTION OF DRAWINGS

FIG. 1 is a cross-sectional view showing components of a light emitting device according to an embodiment.

FIG. 2 is a perspective view of a cross-section of a light emitting device according to an embodiment.

FIG. 3 is a view illustrating a shape of a light incident surface of a light control member of an embodiment.

FIG. 4 is a view illustrating a shape of a light emitting surface of a light control member of an embodiment.

FIG. 5 is a view illustrating a light incident surface and a light emitting surface of a light control member of an embodiment.

FIG. 6 is a view illustrating an operation of a light emitting device according to an embodiment.

FIG. 7 is a view illustrating an incident angle of a light emitting surface of an embodiment.

MODE FOR INVENTION

An embodiment of the light-emitting device according to the present invention will now be described with reference to the accompanying drawings for explaining.

FIG. 1 is a cross-sectional view showing components of a light emitting device according to an embodiment, and FIG. 2 is a perspective view of a cross-section of a light emitting device according to an embodiment.

In FIG. 1 and FIG. 2, the light emitting device 1 is intended to be employed in direct-type backlight of a liquid crystal display, includes a light emitting element 2, a light control member 3 to control and emit the light incident from the light emitting element 2. The light emitting device 1, as shown in FIG. 2, has a rotationally symmetric shape around the optical axis 21. The light emitting device 1, as shown in FIG. 2, has a rotationally symmetric shape around the optical axis 21.

The light emitting element 2 is a light source for emitting light to the surroundings around the optical axis 21, for example, LED (Light Emitting Diode). Here, the optical axis 21 is an optical axis at the center of three-dimensional light flux emitted from the light emitting element 2 which is a point light source.

The light control member 3 includes a light incident surface 31 where light emitted from the light emitting element 2 is inputted and a light emitting surface 32 where the light inputted from the light incident surface 31 is outputted, and is formed in a rotationally symmetric shape with respect to the optical axis 21. Further, the light control member 3 is formed of a light transmitting member for changing the direction of light emitted from the light emitting element 2, and is disposed so as to cover the light emitting element 2.

A concave cavity facing the light emitting element 2 is formed between the light control member 3 and the light emitting element 2, and the light incident surface 31 is formed on the inner surface of the cavity. Further, the light control member 3 has the light emitting surface 32 formed on the outer surface and a bottom surface toward a support member which supports the light emitting element.

Cross-sectional shape of the light incident surface 31 is substantially perpendicular with the optical axis 21 on the optical axis 21, is formed of a convex portion 31a protruding to the light emitting element 2 in a vicinity of the optical axis 21, and has inclination of the contour without changing noticeably at a distance from the optical axis 21, thereby forming a bell shape.

Cross-sectional shape of the light emitting surface 32 is substantially perpendicular with the optical axis 21 on the optical axis 21, is formed of a convex portion 32a protruding oppositely to the light emitting element 2 and a concave portion 32b around the convex portion 32a in a vicinity of the optical axis 21, and has inclination changing of the contour with gradually increasing and shape changing in substantially parallel with the optical axis at a distance from the optical axis 21.

FIG. 3 is a view illustrating a shape of a light incident surface of a light control member of an embodiment.

In FIG. 3, the light incident surface 31 of the light control member 3 is a shape of axis symmetry with respect to the optical axis (reference optical axis) 21, the intersection point of the optical axis 21 and a light emitting surface of the light emitting element 2 is defined as a base point O, and an angle formed by the optical axis 21 and a line OP1 connecting the base point O and an optional point P1 is defined as angle a1.

The shape of the light incident surface 31 is formed that distance D1 between the optional point O and the point P1 is increasing as increasing the angle $\alpha 1$ if the angle $\alpha 1$ is $0 \leq \alpha 1 < \beta 1$ (radian), and the distance D1 between the optional point O and the point P1 is decreasing as increasing the angle $\alpha 1$ if $(\beta 1 \leq \alpha 1 < (\pi/2))$ (radian). Thus, the convex portion 31a is formed within the limit of the angle a1 being $0 \leq \alpha 1 < \beta 1$ (radian)

The predetermined angle $\beta 1$ is an angle in vicinity of the optical axis 21, and can be changeable according to a sort of the light emitting element 2. Further, the predetermined angle ($\beta 1 = (\pi/450)$) (radian) is defined in the embodiment.

Since intensity of light incident in a vicinity of the optical axis 21 is intense, the convex portion 31a is formed in a vicinity of the optical axis 21 of the light incident surface in order to diffuse the light.

FIG. 4 is a view illustrating a shape of a light emitting surface of a light control member of an embodiment.

In FIG. 4, the light emitting surface 32 of the light control member 3 is a shape of axis symmetry with respect to the optical axis (reference optical axis) 21, the intersection point of the optical axis 21 and a light emitting surface of the light emitting element 2 is defined as a base point O, and an angle formed by the optical axis 21 and a line OP2 connecting the base point O and an optional point P2 is defined as angle $\alpha 2$.

The shape of the light emitting surface 32 is formed that distance D2 between the optional point O and the point P2 is decreasing as increasing the angle $\alpha 2$ if the angle $\alpha 2$ is $0 \leq \alpha 2$ (radian), and the distance D2 between the optional point O and the point P2 is increasing as increasing the angle $\alpha 2$ if $\beta 2 \leq \alpha 2 < (p/2)$ (radian). Thus, the convex portion 32a is formed within the limit of the angle $\alpha 2$ being $0 \leq \alpha 2$ (radian)

The predetermined angle $\beta 2$ is an angle in a vicinity of the optical axis 21, and can be changeable according to a sort of the light emitting element 2.

Since intensity of emitted light in a vicinity of the optical axis 21 is intense, the convex portion 32a is formed in a vicinity of the optical axis 21 of the light emitting surface in order to diffuse the light.

FIG. 5 is a view illustrating a light incident surface and a light emitting surface of a light control member of an embodiment.

In FIG. 5, if distance of the optical axis 21 between the light incident surface 31 of the light control member 3 and the base point O is defined as a distance L0, and range of the angle a (radian) of combined and diffused light is defined, a radius of the convex portion 31a becomes r1=L0 tan $\alpha$. Light should be divided by 0.1 degree and tracked in order to define the angle $\alpha$ A distance (thickness) t1 of the optical axis 21 of the light incident surface 31 and the light emitting surface 32 of the light control member 3 is defined and rage of light diffusion of the light emitting surface 32 is defined.

Thickness t2 of the convex portion 31a of the light incident surface 31 is defined as t2=(L1/magnification coefficient). The magnification coefficient is a ratio which is defined by considering brightness balance of entire irradiation surface through analysis of brightness distribution measurement for the irradiation surface where the light emitted from the light emitting surface 32. For example, the magnification coefficient is decreased if the brightness of the irradiation surface in a vicinity of the optical axis is high, and the magnification coefficient is increased if the brightness is low.

Height t3 and width(radius) r2 of the convex portion 32a of the light emitting surface 32 is calculated by multiplying a predetermined coefficient by height t2 and width (radius) r1 of the convex portion 31a of the light incident surface 31. Further, the coefficient is changeable according to distance between the light emitting element 2 and the irradiation surface. For example, the coefficient is about 3.1/2.5 if it is 18 mm.

Operation of the above component will be now described.

FIG. 6 is a view illustrating an operation of a light emitting device according to an embodiment.

In FIG. 6, lights L1~L4 and L9~L12 at a distance from the optical axis 21 which are relatively low in density of luminous flux among lights emitted from the light emitting element 2 are simply diffused more to the light emitting surface 32 except the convex portion 32a of the light control member 3 and irradiated to the irradiation surface 4.

In addition, lights L5~L8 in a vicinity of the optical axis 21 which are relatively high in density of luminous flux among lights emitted from the light emitting element 2 are inputted to the convex portion 32a of the light control member 3, and condensed/diffused by the convex portion 31a with a single focus thereby arriving to the irradiation surface 4.

The lights L5~L8 arriving to the light emitting surface 32 are further condensed and diffused, and the light can be irradiated such that uniformity is superior in a range of the light on the irradiation surface 4 in a vicinity of the optical axis 21.

In the embodiment, the convex portion 31a is formed in a vicinity of the optical axis 21 of the light incident surface 31 of the light control member 3, and the convex portion 32a is formed in a vicinity of the optical axis 21 of the light emitting surface 32, thereby achieving complex diffusion.

Here, an incident angle of the light emitting surface 32 of the light control member 3 according to the embodiment will be described with reference to FIG. 7.

In FIG. 7, light L emitted from the light emitting element 2 is inputted to a point P11. In this time, an incident angle θ1 formed by a normal line H1 and the light L inputted to the point P11 of the light emitting surface 32 is smaller than an incident angle θ2 formed by a normal line H2 and the light L inputted to the point P12 of the light emitting surface 32 of a conventional simple diffusion light control member. The conventional simple diffusion should be necessary to decrease gradually the incident angle 2 in a center of the optical axis for brightness uniformity on the irradiation surface, however, the complex diffusion of the embodiment needs not the above thereby it is possible to be the incident angle θ1 smaller than the incident angle 2.

As described above, in the embodiment, a convex portion 31a in a vicinity of the optical axis 21 of the light incident surface 31 of the light control member 3 and a convex portion 32a in a vicinity of the optical axis 21 of the light emitting surface 31 of the light control member 3, thereby achieving the complex diffusion, and the angle of the light incident (the light diffusion angle formed by the normal line and the light inputted to the light emitting surface 32) of the entire light emitting surface 32 (including the convex portion 32a) is decreased in comparison with conventional simple diffusion, the Fresnel reflection loss is decreased, illuminance of the irradiation surface in a vicinity of the optical axis can be increased, deterioration of the color purity in the irradiation surface can be suppressed and the yellow ring phenomenon can be suppressed.

As the distance between the light control member 3 and the irradiation surface 4 are getting closed, it is possible to prevent the incident angle of the light emitting surface from increasing by increasing the thickness of the convex portions 31a and 32b.

As described above, in the embodiment, a convex portion 31a in a vicinity of the optical axis 21 of the light incident surface 31 of the light control member 3 and a convex portion 32a in a vicinity of the optical axis 21 of the light emitting surface 31 of the light control member 3, thereby increasing illuminance of the irradiation surface in a vicinity of the optical axis, suppressing deterioration of the color purity in the irradiation surface and suppressing the yellow ring phenomenon.

| 1: Light emitting device | 2: Light emitting element |
|---|---|
| 3: Light control member | 4: Irradiation surface |
| 31: Light incident surface | 31a, 32a: Convex portion |
| 32: Light emitting surface | 32b: Concave portion |

The invention claimed is:

1. A light emitting device comprising:
a light emitting element; and
a light control member which has a shape of rotational symmetry with respect to the optical axis and controls light incident from the light emitting element thereby emitting, wherein the light control member comprises a cavity formed between the light emitting element, a light incident surface where light emitted from the light emitting element is inputted, and a light emitting surface where the light inputted through the light incident surface is outputted, and wherein the light incident surface and the light emitting surface respectively have convex portions proximate the optical axis and diffuse light proximate the optical axis, wherein an intersection point of the optical axis and a light emitting surface of the light emitting element is defined as a base point, a first angle formed by the optical axis and a line connecting the base point and a first optional point intersecting the light incident surface is defined as α1, and a first distance between the optional point of the light incident surface and the base point is defined as D1, wherein, for the light incident surface, in a first range of α1 from 0 (radians) to a value defined as β1 the first distance D1 is increasing as α1 increases and in a second range of α1 from β1 to π/2 (radians) the first distance D1 is decreasing as α1 increases and a second angle formed by the optical axis and a line connecting the base point and a second optional point intersecting the light emitting surface is defined as α2, and a second distance between the second optional point and the base point is defined as D2, wherein, for the light emitting surface, in a first range of α2 from 0 (radians) to a value defined as β2 the second distance D2 is decreasing as α2 increases and in a second range of α2 from β2 to π/2 (radians) the second distance D2 is increasing as α2 increases.

2. The light emitting device of claim 1, wherein the predetermined angle β1 is π/450 (radian).

3. The light emitting device of claim 1, wherein the convex portion of the light incident surface intersects the optical axis.

4. The light emitting device of claim 3, wherein the convex portion of the light emitting surface intersects the optical axis.

5. The light emitting device of claim 1, wherein the convex portion of the light emitting surface intersects the optical axis.

6. The light emitting device of claim 1, wherein relatively high in density of luminous flux among lights emitted from the light emitting element are inputted to the convex portion of the light incident surface and condensed by the convex portion of the light incident surface to form a single focus between the convex portions.

* * * * *